United States Patent [19]

Dalmasso

[11] 3,775,838

[45] Dec. 4, 1973

[54] INTEGRATED CIRCUIT PACKAGE AND CONSTRUCTION TECHNIQUE

[75] Inventor: Claudio Dalmasso, Ivrea, Italy

[73] Assignee: Ing. C. Olivetti & C. S.p.A., Ivrea, Italy

[22] Filed: Apr. 24, 1972

[21] Appl. No.: 246,595

Related U.S. Application Data

[63] Continuation of Ser. No. 120,185, March 2, 1971, abandoned.

[52] U.S. Cl. ........................ 29/577, 29/578, 29/580, 29/589

[51] Int. Cl. ........................ B01j 17/00

[58] Field of Search ........................ 29/577, 578, 580, 29/589

[56] References Cited

UNITED STATES PATENTS

| | | | |
|---|---|---|---|
| 3,488,840 | 1/1970 | Hymes et al. | 29/589 |
| 3,470,611 | 10/1969 | McIver et al. | 29/589 |
| 3,556,951 | 1/1971 | Cerneglia | 204/15 |
| 3,561,107 | 2/1971 | Best et al. | 29/589 |

*Primary Examiner*—Charles W. Lanham
*Assistant Examiner*—W. Tupman
*Attorney*—Birch, Swindler, McKie & Beckett

[57] ABSTRACT

Disclosed is an integrated circuit arrangement and construction technique wherein an improved circuit board, having deposited thereon resistors and conductors, is constructed by means of a combination of evaporation and electrodeposition techniques. A layer of resistive material and a layer of conductive material are successively deposited by means of evaporation onto a substrate. A third layer of conductive material is then deposited by means of electroplating. The construction process includes a high temperature stabilization phase, an improved resistor trim by means of electroerosion, and a semiconductor afixation phase which utilizes high temperature gas in conjunction with mechanical friction.

4 Claims, 4 Drawing Figures

INVENTOR
CLAUDIO DALMASSO

BY Birch, Swindler, McKie & Beckett
ATTORNEYS

INVENTOR.
CLAUDIO DALMASSO

BY

ATTORNEYS

INVENTOR.
CLAUDIO DALMASSO

BY

ATTORNEYS

INVENTOR.
CLAUDIO DALMASSO
BY
ATTORNEYS

INTEGRATED CIRCUIT PACKAGE AND CONSTRUCTION TECHNIQUE

CROSS REFERENCE TO A RELATED APPLICATION techniques are notoriously inefficient.

This application is a continuation of U.S. application, Ser. No. 120,185 filed Mar. 2, 1971, and now abandoned.

BACKGROUND OF THE INVENTION

1. Field of the invention

The invention relates to the complete manufacturing process used in the construction of integrated circuit arrangements and packages and includes those techniques used to construct the conductive and resistive strata of the printed circuit board and those techniques used to insure a long life of proper and reliable functioning of these strata. Also included are those techniques whereby the active elements can be afixed to the conductive strata and whereby the package can be encapsulated.

2. Description Of The Prior Art

Prior techniques for preparing printed circuit boards for integrated circuits have depended upon the utilization of evaporation technology to deposit the resistive and conductive networks on the insulative substrate of the circuit board. Conventionally the board is prepared by means of the evaporation of a strata of resistive material and subsequent evaporation of a strata of conductive material. By a series of photoresist applications and etching processes certain areas are stripped of both the conductive and resistive strata; other areas are stripped of only the conductive stratum; while still other areas are left intact. At this point, the active semiconductive elements are afixed by means of ordinary techniques and the circuit board is encapsulated.

SUMMARY OF THE INVENTION

According to the teachings of the present invention, integrated circuit arrangements can be constructed which offer substantial advantages over the prior circuits. A relatively thick layer of electrodeposited conductive material is added in order to allow for high current carrying ability; a high temperature stabilization phase insures reliability; a particularly efficient electroerosion trimming phase insures proper resistive values; and the active semiconductors are afixed by means of a hot gas-mechanical friction technique.

A base member of ceramic is covered with a thin layer of glass and two metallic evaporation strata, the first, resistive (e.g. NiCr), the second, conductive (e.g. gold). The evaporated layers are relatively thin, for example, 150 Angstroms of NiCr and 500 Angstroms of gold. The next step, instead of being an etching operation, is one of electrodeposition of a further layer of gold or aluminium. This electrodeposited layer of gold is applied only to those areas which are to be conductor network and those areas onto which the active semiconductor elements are to be afixed. This extra gold layer is relatively quite thick (e.g. 2.5 –5 microns) and, therefore, capable of carrying far more energy than the conventional thin evaporated gold layer. Further, the relative thickness of the gold allows the semiconductor elements to be afixed thereto by means of a heated gas-mechanical friction technique which could not be used on the thin evaporated layer. The fact that this third layer is deposited by means of electroplating unto a second evaporated layer is significant. As aforementioned, there are substantial advantages in having a relatively thick conductor layer. It is impratical to obtain thick layers by means of evaporation because evaporation techniques are notoriously ineffecient. Most of the evaporated metal ends up coating the chamber while only a small percentage of the material finds its way to the substrates. When dealing with a metal such as gold, this fact obviously makes evaporation in thick layers unacceptable.

As aforementioned, between the electrodeposited conductive material (e.g. gold) and the evaporated resistive material (e.g. NiCr), there is a thin stratum of evaporated conductive material. This thin evaporation layer provides a suitable base for the electrodeposited layer and is used to insure high resolution in the resistor etching phase.

After the electrodeposition phase, the circuit board undergoes a series of etching processes to create the conductive, insulative, and resistive networks and then the board passes through a high temperature stabilization phase which insures that the resistive networks do not undergo subsequent variations in value and also detects casual structural imperfections in the strata. In the stabilization phase, the board is heated at high temperatures for a substantial period of time, which heating reorganizes the structure of the resistive material so that this material will withstand subsequent heating.

After the stabilization phase, the resistive networks are automatically checked, and those resistors which evince an unacceptably low resistance are subjected to an electroerosion process. The active semiconductor elements are then afixed to the conductive areas of the board by means of hot gas used in conjunction with mechanical friction to form a eutectic. After the welding of output lugs and encapsulation in silicon and liquid epoxy resin, the circuit is ready for use.

It is therefore an object of this invention to provide an improved integrated circuit arrangement.

It is a further object of this invention to provide an efficient and effective process for the construction of integrated circuit arrangements.

It is a further object of this invention to provide a circuit board having relatively thin evaporated resistive and conductive layers and a further relatively thick electrodeposited conductive layer.

It is a further object of this invention to provide a manufacturing process for the construction of circuit arrangements which includes a high temperature stabilization phase.

It is a further object of this invention to provide a manufacturing process for the construction of circuit arrangements which includes a resistor checking and electroerosion phase.

It is a further object of this invention to provide a manufacturing process for the construction of circuit arrangements which includes the afixation of semiconductor elements by means of hot gas and mechanical friction.

DESCRIPTION OF THE PREFERRED EMBODIMENT

Figure 1:
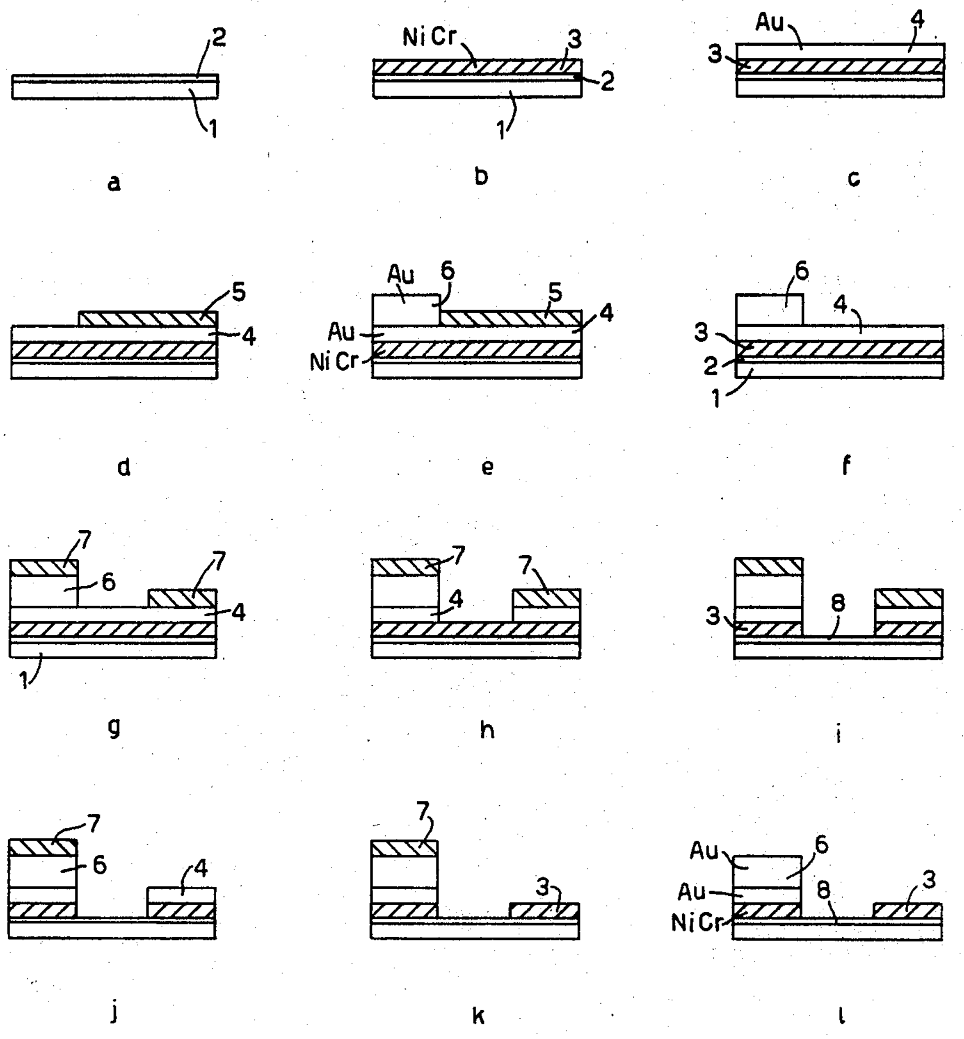
FIG. 1, *a*–l, illustrates in schematic form the steps used in the construction of the printed circuit board.

FIG. 1, a through l, illustrates schematically the steps utilized to construct the printed circuit board in accordance with the teaching of this invention. FIG. 1–*a* shows a ceramic base member 1 having deposited thereon a thin layer of glass 2. The member 1 may be constructed of allumina.

FIG. 1–*b* shows a layer of resistive metallic material 3 which can be, for example, NiCr and which is deposited by well known evaporation techniques onto base member 1. Layer 3 is approximately 180 Angstroms in thickness and, if constructed of NiCr, has a resistivity of 100 ohms per square.

A layer 4 of metallic conductive material (e.g. gold) is deposited by means of evaporation onto NiCr layer 3 to a thickness of approximately 500–1,000 Angstroms as is depicted in FIG. 1–*c*.

The next step consists of masking those areas which are not to be highly conductive, that is, are either to be insulative or resistive. This first mask 5 (FIG. 1–*d*) is applied to evaporated gold layer 4. The structure of FIG. 1–*d* is then immersed in an electrolytic gold bath, made a cathode, and a layer of electrodeposited gold 6 (FIG. 1–*e*) is allowed to build up on those areas of evaporated gold stratum 4 which are not covered by mask 5. The strata 6 of electrodeposited gold is relatively quite thick (2.5 – 5 microns) as compared with the evaporated layers of gold 4 (e.g. 500–1,000 Angstroms) and NiCr (e.g. 180 Angstroms). This relative thickness of layer 6 allows for high current carrying capacity with little danger of electrical or mechanical failure. Further this thickness allows for a sound foundation upon which the active semiconductor elements can be mounted. These active elements are afixed by means of hot gas immersion coupled with a mechanical rubbing of the element on the surface of layer 6. If layer 6 was thin, this rubbing would be dangerous or impossible as it could easily cause a rupturing of the thin layer. Electrodeposited gold layer 6 will comprise the network of electrical conductors. As aforementioned the resistive material can be NiCr and the conductive layers gold. Equivalent materials for both the resistive and conductive layers exist. For example, the resistive layer can be chromium, tantalum, tantalum pentoxide, or tantalum nitride, while nickel, copper and aluminum are potential conductive materials. In general, the conductive materials are $10^2$ to $10^8$ times more conductive than the resistive materials.

The next step is the removal of photoresist 5 (FIG. 1–*f*) followed by the application of photoresist 7 (FIG. 1–*g*). Photoresist 7 is applied to those areas which are to be resistive and the conductive portions of the electrical network of the printed circuit; the areas which are to be insulated (i.e. etched to substrate 1) are left exposed.

After the application of photoresist 7, the structure is immersed in a gold etch so as to remove the exposed evaporated gold layer 4 (FIG. 1–*h*). The structure is then immersed in a NiCr etch, thereby removing the exposed NiCr (FIG. 1–*i*) and leaving area 8 which is the insulated network of the printed circuit.

Photoresist layer 7 is then selectively exposed so that those areas which are to be resistive will be subject to etching. FIG. 1–*j* shows the photoresist removed from the area to the resistive. The area which is to be highly conductive retains the unexposed layer of photoresist 7.

The structure is then inserted into a gold etch which removes the exposed portion of evaporated gold layer 4 thereby exposing that portion of NiCr (FIG. 1–*k*) which is to comprise the resistive portion of the printed circuit.

The final step is to remove mask 7. The printed circuit has conductive network consisting of gold layer 6, resistive network consisting of NiCr layer 3, and insulative regions 8 (FIG. 1–*l*).

Figure 2:
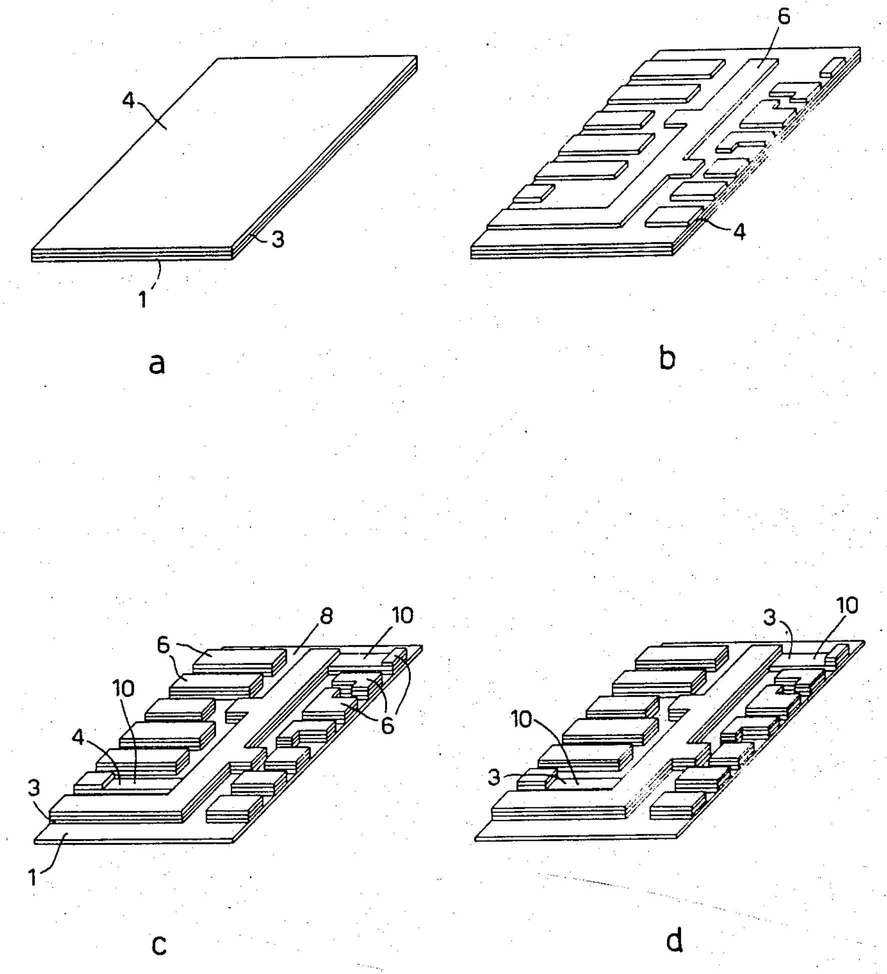
FIG. 2, *a–d*, is an isometric view depicting the sequential steps in the construction of the circuit board.

FIG. 2 depicts isometric views which illustrate the sequential steps in the construction of the circuit board. There is seen in FIG. 2–*a* the board at same the stage which is schematically illustrated in FIG. 1–*c*. FIG. 2–*a* shows substrate 1 constituted of ceramic upon which are layers of resistive material 3 and conductive material 4. Layer 3 (eg NiCr) is approximately 180 Angstroms in thickness and is deposited by means of evaporation. Layer 4 (eg gold) is also deposited by evaporation and is approximately 500–1,000 Angstroms thick, as has been discussed in connection with FIG. 1.

FIG. 2–*h* shows network 6 which network corresponds to the conductive portion of the printed circuit. As has been mentioned, network 6 is a relatively thick layer (2.5 – 5 microns) of conductive material (eg gold) which has been applied to evaporated layer 4 by means of electrolysis. FIG. 2*b* corresponds to FIG. 1–*f*.

In FIG. 2–*c* there is seen the circuit board after the removal of the evaporated gold and NiCr layers to thereby create the insulative network 8. FIG. 2–*c*, which corresponds to FIG. 1–*l*, shows insulative network 8, conductive portions 6 and regions 10 which consist of evaporated gold layer 4 and evaporated NiCr layer 3. Insulative network 8 is, of course, nothing but the stripped alumina substrate 1 while regions 10 are those areas which will ultimately be the resistors of the circuit.

FIG. 2–*d* shows the final circuit board where the evaporated gold layer has been removed from regions 10, thereby rexposing NiCr layer 3, which layer is the resistive portion of the network. FIG. 2–*d*, which corresponds to FIG. 1–*l*, illustrates the completed printed circuit board.

Figure 3:
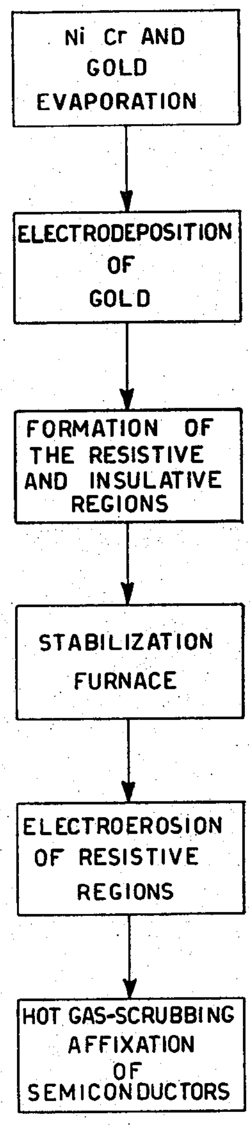
FIG. 3 is a flow chart of the manufacturing process according to the teachings of the invention.

After the conductive and resistive portions of the circuit board have been prepared, the board enters the final stages of the manufacturing process. Referring to the flow chart of FIG. 3, it is seen that, after the etching phase, the board is immersed in a stabilizing furnace. In the furnace, the board undergos a heating cycle in an inert atmosphere. The board is heated at 250° C in an atmosphere of nitrogen for 2 to 3 hours. This heating reorganizes the structure of the resistive alloy and thereby insures that the resistor values will not vary when the resistor is subsequently reheated during operation or during the active element afixation stage.

After stabilization, the resistance values are measured and those resistors which are too low in ohmage are trimmed by an automatic electroerosion device. This electroerosion device is described in co-pending application, Ser. No. 120,185, filed Mar. 2, 1971.

The final phase of the process is the afixation of the active semiconductor elements to the electrodeposited gold strata.

This is accomplished by means of an operation wherein the semiconductor element is placed on the circuit board and subjected to a stream of hot gas. While being so heated, the semiconductor element is scrubbed on the board's surface. The heating, together with the mechanical friction, causes a eutetic to be formed between the silicon of the semiconductor and the gold of the circuit board.

Figure 4:
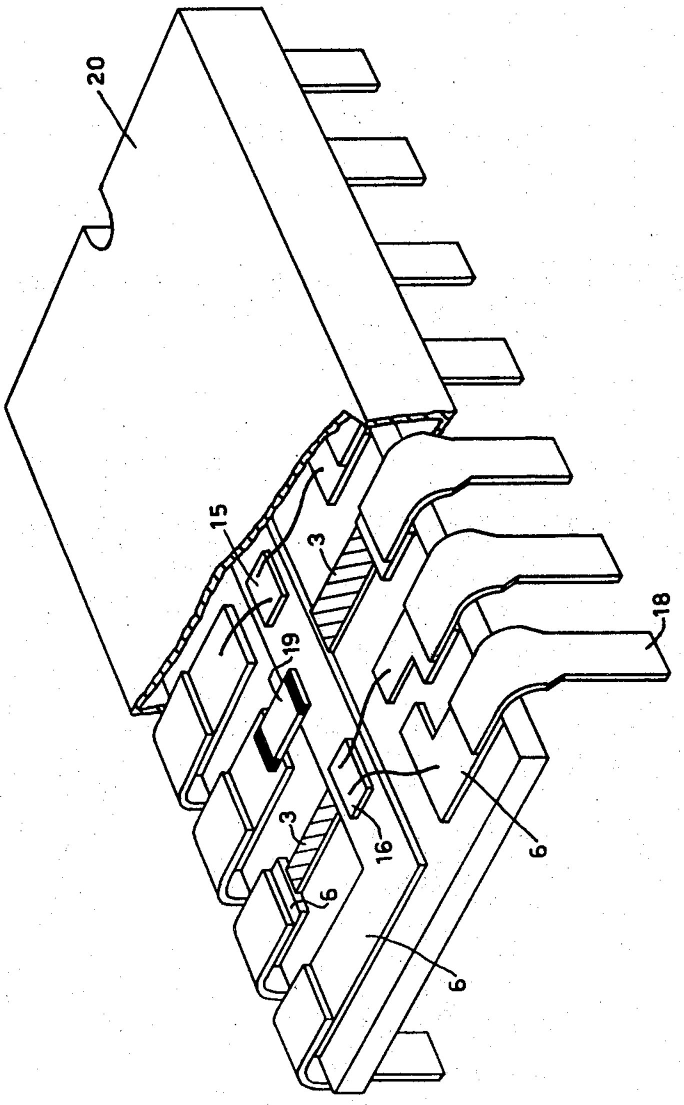
FIG. 4 is an isometric view of the completed circuit structure.

FIG. 4 is an isometric view depicting the completed circuit package. Semiconductor elements 15 and 16 are mounted on electrodeposited gold conductive network 6.

Resistor paths 3 of NiCr link portions of conductor network 6 and lugs 18 are spot welded to the peripheral portions of the network 6. Elements such as transistors 15 and 16 and capacitor 19 are afixed to conductive layer 6 by hot gas and mechanical friction as aforedescribed.

The completed circuit arrangement is encased in epoxy 20.

I claim:

1. A process for the manufacture of semiconductor carrying circuit boards including the following chain of steps;

a. depositing, by evaporation, an electrically resistive layer on to a substrate of insulative material;
b. depositing, by evaporation a first electrically conductive layer on to said resistive layer;
c. depositing, by electroplating, a second conductive layer on to said first conductive layer, said second conductive layer being deposited only on a first region;
d. removing, only from a second region different from, and not including, said first region, both said first conductive layer and said resistive layer;
e. removing, only from a third region different form, and not including, either said first or said second region, only said first conductive layer;
f. said first, second and third regions forming the conductors, insulators, and resistors, respectively, of an electrical circuit network and,
g. affixing semiconductor circuit elements to said second conductive layer by means of heating said elements with hot gas while scrubbing said elements on said second conductive layer to create friction between said elements and said second conductive layer whereby a eutetic is formed between the semiconductor material of said elements and said second conductive layer.

2. The process according to claim 1 wherein said conductive layers are of gold, said resistive layer is NiCr, and said insulative layer is ceramic.

3. The process according to claim 1 wherein said second conductive layer is 2.5 to 5 microns in thickness.

4. The process according to claim 1 comprising following said step of removing said first conductive layer and said resistive layer only from said second region, the additional step of:

heating said circuit network in an inert atmosphere prior to said step of affixing said semiconductor circuit elements to said second conductive layer.

* * * * *

UNITED STATES PATENT OFFICE
CERTIFICATE OF CORRECTION

Patent No. 3,775,838 Dated 12/4/73

Inventor(s) Claudio Dalmasso

It is certified that error appears in the above-identified patent and that said Letters Patent are hereby corrected as shown below:

On the first page of the patent, insert

--Foreign Application Priority Data

| | | |
|---|---|---|
| March 20, 1970 | Italian | 6794-A/70 |
| July 10, 1970 | Italian | 69388-A/70 -- |

At col. 1, line 4 delete "techniques are notoriously in-efficient."

Signed and sealed this 10th day of September 1974.

(SEAL)
Attest:

McCOY M. GIBSON, JR.
Attesting Officer

C. MARSHALL DANN
Commissioner of Patents